(12) United States Patent
Bolender et al.

(10) Patent No.: US 9,748,952 B2
(45) Date of Patent: Aug. 29, 2017

(54) INPUT DEVICE WITH INTEGRATED DEFORMABLE ELECTRODE STRUCTURE FOR FORCE SENSING

(75) Inventors: Robert James Bolender, Santa Clara, CA (US); Narain Kumar Vijayashanker, Palo Alto, CA (US); Joseph Kurth Reynolds, Alviso, CA (US); Lin-Hsiang Hsieh, Taoyuan (TW); Shwetank Kumar, Sunnyvale, CA (US)

(73) Assignee: Synaptics Incorporated, San Jose, CA (US)

(*) Notice: Subject to any disclaimer, the term of this patent is extended or adjusted under 35 U.S.C. 154(b) by 872 days.

(21) Appl. No.: 13/238,783

(22) Filed: Sep. 21, 2011

(65) Prior Publication Data

US 2013/0068038 A1    Mar. 21, 2013

(51) Int. Cl.
*G01L 1/00* (2006.01)
*H03K 17/955* (2006.01)
(Continued)

(52) U.S. Cl.
CPC .......... *H03K 17/955* (2013.01); *G01L 1/142* (2013.01); *G01L 1/146* (2013.01); *G06F 3/0338* (2013.01);
(Continued)

(58) Field of Classification Search
USPC .................................................. 73/862.626
See application file for complete search history.

(56) References Cited

U.S. PATENT DOCUMENTS 4,290,052 A * 9/1981 Eichelberger et al. ......... 341/33
4,719,538 A    1/1988 Cox
(Continued)

FOREIGN PATENT DOCUMENTS

JP     7280671 A     10/1995
JP     2009009249 A1  1/2001
(Continued)

OTHER PUBLICATIONS

USPTO, Final Office Action in U.S. Appl. No. 12/418,433, mailed Jul. 19, 2013.
(Continued)

*Primary Examiner* — Harshad R Patel
*Assistant Examiner* — Brandi Hopkins
(74) *Attorney, Agent, or Firm* — Osha Liang LLP

(57) ABSTRACT

Devices and methods are provided that facilitate improved input device performance. The devices and methods utilize a first electrode and a second electrode disposed on a first substrate and a deformable electrode structure. The deformable electrode structure overlaps the first electrode and the second electrode to define a variable capacitance between the first electrode and the second electrode that changes with the deformation of the deformable electrode structure. The deformable electrode structure comprises a spacing component configured to provide spacing between the deformable electrode structure and the first electrode and the second electrode. Finally, a transmission component is configured such that biasing the transmission component causes the deformable electrode structure to deform and change the variable capacitance. A measurement of the variable capacitance can be used to determine force information regarding the force biasing the transmission component.

18 Claims, 9 Drawing Sheets

(51) Int. Cl.
    G01L 1/14      (2006.01)
    G06F 3/0338    (2013.01)
    H03K 17/96     (2006.01)
(52) U.S. Cl.
    CPC . *H03K 17/962* (2013.01); *H03K 2217/96077* (2013.01); *H03K 2217/960775* (2013.01)

(56) References Cited

U.S. PATENT DOCUMENTS

| | | | |
|---|---|---|---|
| 5,492,020 A | 2/1996 | Okada | |
| 5,510,813 A | 4/1996 | Makinwa et al. | |
| 5,854,625 A | 12/1998 | Frisch et al. | |
| 5,942,733 A | 8/1999 | Allen et al. | |
| 5,945,980 A | 8/1999 | Moissev et al. | |
| 5,973,668 A | 10/1999 | Watanabe | |
| 6,002,389 A | 12/1999 | Kasser | |
| 6,032,536 A * | 3/2000 | Peeters | G01L 1/20 399/16 |
| 6,215,476 B1 | 4/2001 | Depew et al. | |
| 6,642,857 B1 | 11/2003 | Schediwy et al. | |
| 6,888,537 B2 | 5/2005 | Benson et al. | |
| 6,958,614 B2 | 10/2005 | Morimoto | |
| 7,047,818 B2 | 5/2006 | Dallenbach et al. | |
| 7,148,882 B2 | 12/2006 | Kamrath et al. | |
| 7,196,694 B2 | 3/2007 | Roberts | |
| 7,398,587 B2 | 7/2008 | Morimoto | |
| 7,451,659 B2 | 11/2008 | Dallenbach et al. | |
| 7,499,040 B2 | 3/2009 | Zadesky et al. | |
| 7,656,465 B2 * | 2/2010 | Takeda et al. | 349/38 |
| 7,728,487 B2 | 6/2010 | Adachi et al. | |
| 7,743,667 B2 | 6/2010 | Harish et al. | |
| 7,784,366 B2 | 8/2010 | Daverman et al. | |
| 7,786,655 B2 | 8/2010 | Park et al. | |
| 7,903,091 B2 | 3/2011 | Lee et al. | |
| 8,120,229 B2 | 2/2012 | Huang | |
| 8,169,416 B2 | 5/2012 | Han | |
| 8,698,769 B2 | 4/2014 | Coulson et al. | |
| 2002/0019711 A1 | 2/2002 | Miyashita et al. | |
| 2002/0180710 A1 | 12/2002 | Roberts | |
| 2003/0151589 A1 | 8/2003 | Bensen et al. | |
| 2004/0112149 A1* | 6/2004 | Gebert | 73/862.626 |
| 2004/0155991 A1 | 8/2004 | Lowles et al. | |
| 2004/0227736 A1 | 11/2004 | Kamrath et al. | |
| 2005/0052425 A1 | 3/2005 | Zadesky et al. | |
| 2005/0057266 A1 | 3/2005 | Morimoto | |
| 2005/0057528 A1 | 3/2005 | Kleen | |
| 2005/0061082 A1 | 3/2005 | Dallenbach et al. | |
| 2006/0017701 A1 | 1/2006 | Marten et al. | |
| 2006/0065973 A1 | 3/2006 | Dallenbach et al. | |
| 2006/0197753 A1 | 9/2006 | Hotelling | |
| 2007/0046642 A1 | 3/2007 | Lee et al. | |
| 2007/0063982 A1 | 3/2007 | Tran | |
| 2007/0229464 A1 | 10/2007 | Hotelling et al. | |
| 2007/0229470 A1 | 10/2007 | Snyder et al. | |
| 2007/0236450 A1 | 10/2007 | Colgate et al. | |
| 2007/0257821 A1 | 11/2007 | Son et al. | |
| 2007/0268265 A1 | 11/2007 | XiaoPing | |
| 2008/0018608 A1 | 1/2008 | Serban et al. | |
| 2008/0018611 A1 | 1/2008 | Serban et al. | |
| 2008/0062148 A1 | 3/2008 | Hotelling et al. | |
| 2008/0068348 A1 | 3/2008 | Rosenberg et al. | |
| 2008/0142352 A1 | 6/2008 | Wright | |
| 2008/0190210 A1 | 8/2008 | Harish et al. | |
| 2008/0202251 A1* | 8/2008 | Serban et al. | 73/780 |
| 2008/0202824 A1 | 8/2008 | Philipp et al. | |
| 2009/0001853 A1 | 1/2009 | Adachi et al. | |
| 2009/0002328 A1 | 1/2009 | Ullrich et al. | |
| 2009/0160682 A1 | 6/2009 | Bolender et al. | |
| 2009/0160763 A1 | 6/2009 | Cauwels et al. | |
| 2009/0167704 A1 | 7/2009 | Terlizzi et al. | |
| 2009/0243817 A1 | 10/2009 | Son | |
| 2009/0244017 A1 | 10/2009 | Pala et al. | |
| 2009/0267892 A1 | 10/2009 | Faubert | |
| 2010/0018889 A1 | 1/2010 | Korpanty et al. | |
| 2010/0020039 A1 | 1/2010 | Ricks et al. | |
| 2010/0024573 A1 | 2/2010 | Daverman et al. | |
| 2010/0026664 A1 | 2/2010 | Geaghan | |
| 2010/0033354 A1 | 2/2010 | Ejlersen | |
| 2010/0079384 A1 | 4/2010 | Grivna | |
| 2010/0090813 A1 | 4/2010 | Je et al. | |
| 2010/0107770 A1 | 5/2010 | Serban et al. | |
| 2010/0108409 A1 | 5/2010 | Tanaka et al. | |
| 2010/0149128 A1 | 6/2010 | No et al. | |
| 2010/0156814 A1 | 6/2010 | Weber et al. | |
| 2010/0244628 A1 | 9/2010 | Nishigaki et al. | |
| 2010/0250071 A1 | 9/2010 | Pala et al. | |
| 2010/0271328 A1* | 10/2010 | Sekiguchi | G06F 3/044 345/174 |
| 2011/0005845 A1 | 1/2011 | Hotelling et al. | |
| 2011/0025631 A1 | 2/2011 | Han | |
| 2011/0148811 A1* | 6/2011 | Kanehira et al. | 345/174 |
| 2011/0148812 A1 | 6/2011 | Hente | |
| 2011/0175844 A1 | 7/2011 | Berggren | |
| 2011/0278078 A1 | 11/2011 | Schediwy et al. | |
| 2012/0075243 A1 | 3/2012 | Doi et al. | |
| 2012/0086307 A1 | 4/2012 | Kandori et al. | |
| 2012/0090902 A1 | 4/2012 | Liu et al. | |
| 2012/0098783 A1 | 4/2012 | Badaye et al. | |
| 2012/0105333 A1 | 5/2012 | Maschmeyer et al. | |
| 2012/0242610 A1 | 9/2012 | Yasumatsu | |

FOREIGN PATENT DOCUMENTS

| | | |
|---|---|---|
| WO | 9718528 | 5/1997 |
| WO | 2005121729 A1 | 12/2005 |
| WO | 2007098171 A3 | 8/2007 |
| WO | 2009157614 A1 | 12/2009 |
| WO | 2010018889 A1 | 2/2010 |

OTHER PUBLICATIONS

USPTO, Office Action in U.S. Appl. No. 12/777,829, mailed Jul. 23, 2013.
USPTO, U.S. Non-Final Office Action mailed Sep. 20, 2012 for U.S. Appl. No. 12/777,829, filed May 11, 2010.
International Bureau, International Search Report and Written Opinion for International Application No. PCT/US2012/052909 dated Dec. 26, 2012.
United States Patent and Trademark Office, US Non-final Office Action for U.S. Appl. No. 12/418,433, dated Jan. 7, 2013.
USPTO, US Final Office Action issued in U.S. Appl. No. 12/777,829, mailed Feb. 22, 2013.
International Bureau, Preliminary Report on Patentability for International Application No. PCT/US2011/034261 dated Nov. 22, 2012.
International Bureau, International Search Report and Written Opinion for International Application No. PCT/US2012/034540 dated Nov. 30, 2012.
Korean Intellectual Property Office, International Searching Authority, "International Search Report" mailed Nov. 19, 2010; International Appln. No. PCT/US2010/029823 filed Apr. 2, 2010.
International Bureau, International Search Report and Written Opinion for International Application No. PCT/US2012/060500 dated Jan. 2, 2013.
Korean Intellectual Property Office, International Searching Authority, "International Search Report" mailed Feb. 8, 2012; International Appln. No. PCT/US2011/034261, filed Apr. 28, 2011.
USPTO "Non-Final Office Action" mailed Feb. 3, 2012; U.S. Appl. No. 12/418,433, filed Apr. 3, 2009.
USPTO "Final Office Action" mailed Aug. 2, 2012 for U.S. Appl. No. 12/418,433, filed Apr. 3, 2009.
USPTO, Final Office Action for U.S. Appl. No. 13/316,279, mailed Aug. 14, 2014.
USPTO, Final Office Action for U.S. Appl. No. 12/418,433, mailed Sep. 29, 2014.
USPTO, Office Action for U.S. Appl. No. 13/094,658, mailed Oct. 9, 2014.
USPTO, Final Office Action for U.S. Appl. No. 12/777,829, mailed Oct. 29, 2014.

(56) References Cited

OTHER PUBLICATIONS

USPTO, Final Office Action in U.S. Appl. No. 12/777,829, mailed Mar. 6, 2014.
USPTO, Office Action in U.S. Appl. No. 12/418,433, mailed Mar. 20, 2014.
USPTO, Office Action in U.S. Appl. No. 13/316,279, mailed Mar. 28, 2014.
USPTO, Response to Non-Final Office Action in U.S. Appl. No. 12/777,829, mailed Nov. 25, 2013.
USPTO, Response to Final Office Action in U.S. Appl. No. 12/418,433, mailed Jan. 21, 2014.
USPTO, Response to Restriction Requirement in U.S. Appl. No. 13/316,279, mailed Feb. 11, 2014.
International Bureau, International Preliminary Report on Patentability in Application No. PCT/US2012/052909, dated Mar. 25, 2014.
USPTO, Office Action in U.S. Appl. No. 12/777,829, mailed May 2, 2014.
International Preliminary Report on Patentability in counterpart PCT/US2010/029823, mailed Oct. 4, 2011 (5 pages).
International Preliminary Report on Patentability in counterpart PCT/US2012/034540, mailed Oct. 29, 2013 (5 pages).
USPTO, Office Action mailed May 26, 2015 for U.S Appl. No. 13/094,658 (13 pages).
USPTO, Office Action mailed Dec. 22, 2015 for U.S. Appl. No. 13/094,658 (14 pages).
Office Action issued in counterpart Chinese Patent Application No. 201280046102.6, mailed Dec. 7, 2016 (20 pages).

\* cited by examiner

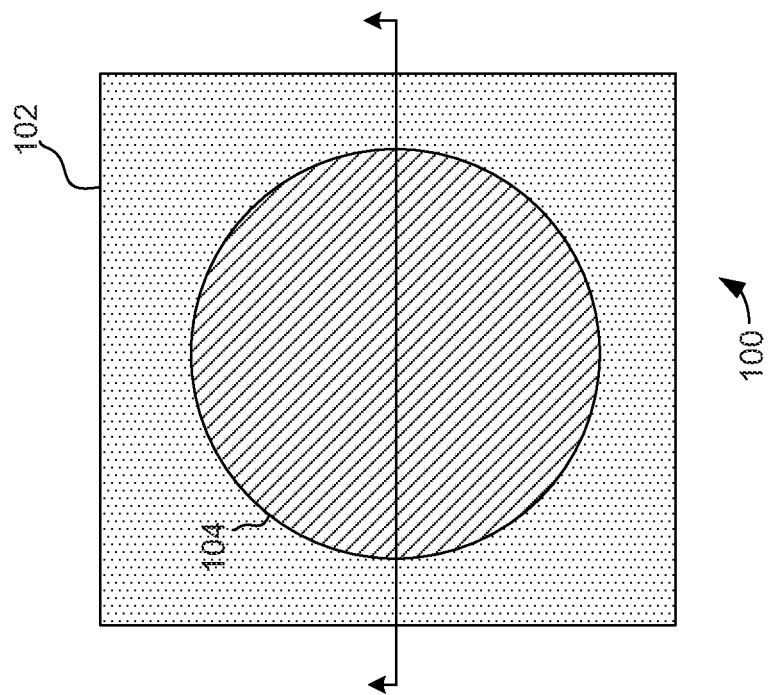
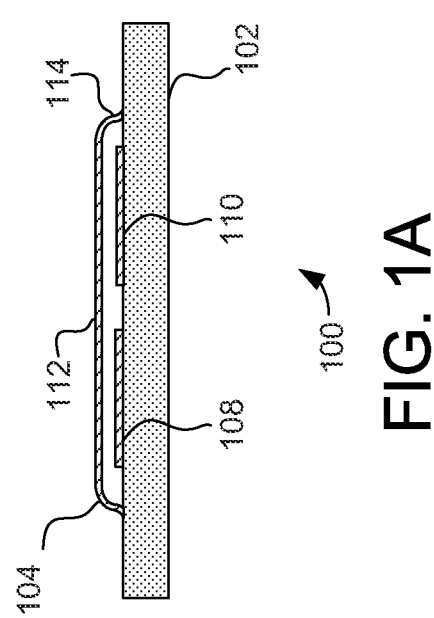
FIG. 1B
FIG. 1A

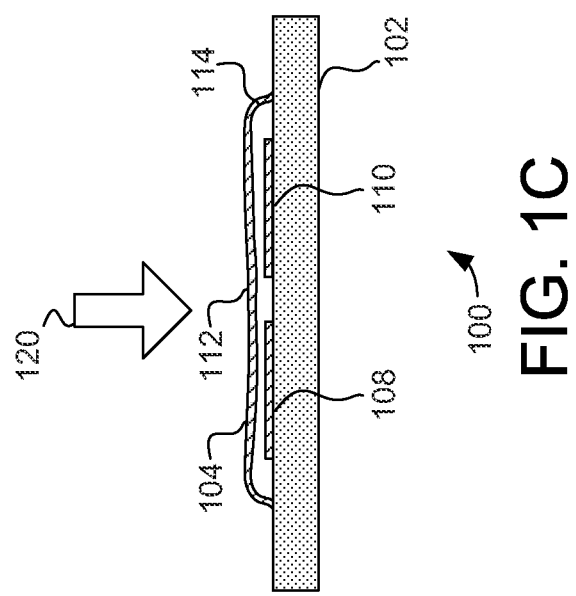

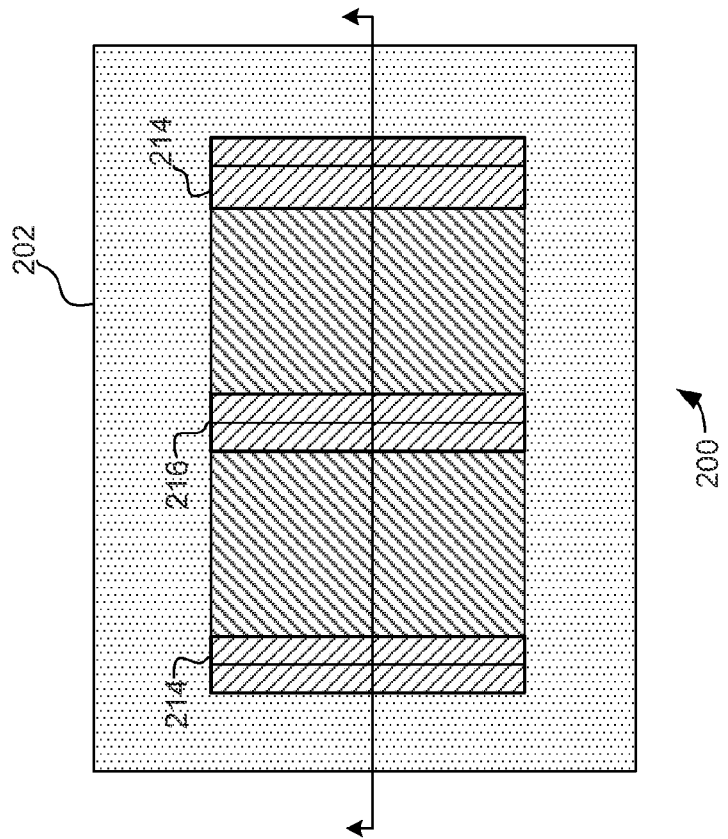
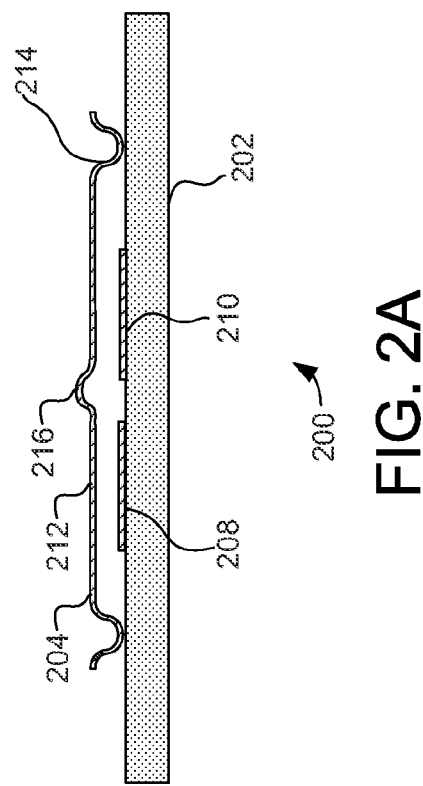
FIG. 2B
FIG. 2A

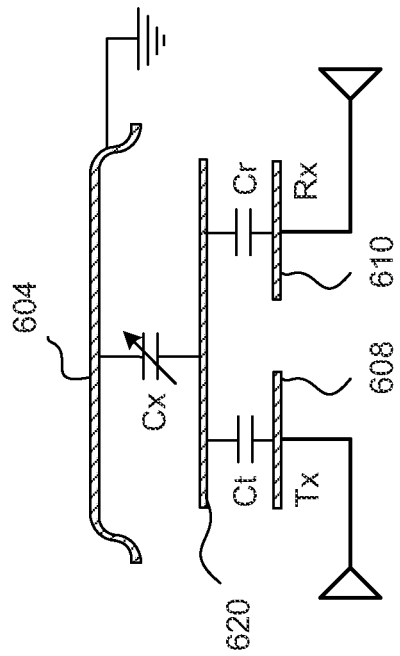
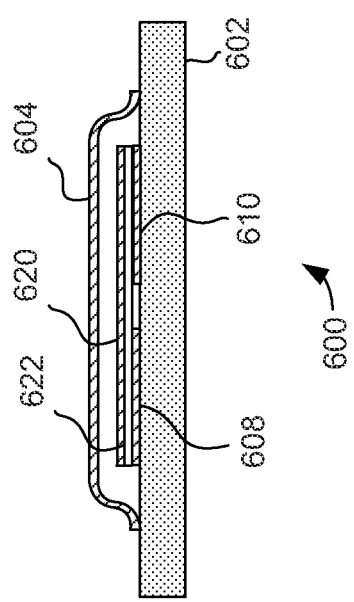
FIG. 6B
FIG. 6A

INPUT DEVICE WITH INTEGRATED DEFORMABLE ELECTRODE STRUCTURE FOR FORCE SENSING

FIELD OF THE INVENTION

This invention generally relates to electronic devices, and more specifically relates to input devices, such as proximity sensor devices and force sensor devices.

BACKGROUND OF THE INVENTION

Proximity sensor devices (also commonly called touch sensor devices) are widely used in a variety of electronic systems. A proximity sensor device typically includes a sensing region, often demarked by a surface, in which input objects can be detected. Example input objects include fingers, styli, and the like. The proximity sensor device can utilize one or more sensors based on capacitive, resistive, inductive, optical, acoustic and/or other technology. Further, the proximity sensor device may determine the presence, location and/or motion of a single input object in the sensing region, or of multiple input objects simultaneously in the sensor region.

The proximity sensor device can be used to enable control of an associated electronic system. For example, proximity sensor devices are often used as input devices for larger computing systems, including: notebook computers and desktop computers. Proximity sensor devices are also often used in smaller systems, including: handheld systems such as personal digital assistants (PDAs), remote controls, and communication systems such as wireless telephones and text messaging systems. Increasingly, proximity sensor devices are used in media systems, such as CD, DVD, MP3, video or other media recorders or players. The proximity sensor device can be integral or peripheral to the computing system with which it interacts.

In the past, some proximity sensors have been implemented with additional ability to detect and determine force applied to a surface of the sensor. For example, by making an estimation of applied force by measuring the increased capacitance that is the result of the increased contact area when a finger is pressed against the surface. Unfortunately, some implementations of these proximity sensors have had limited accuracy when estimating applied force using these techniques. Because of questionable accuracy, such sensors have typically had limited ability to use such determined force as a basis for determining user input. This limits the flexibility of the proximity sensor device to function as an input device. Thus, there exists a need for improvements in proximity sensor device, and in particular, the ability of proximity sensor devices to determine and respond to indications of applied force.

Other desirable features and characteristics will become apparent from the subsequent detailed description and the appended claims, taken in conjunction with the accompanying drawings and the foregoing technical field and background.

BRIEF SUMMARY OF THE INVENTION

Devices and methods are provided that facilitate improved input device performance. The devices and methods utilize a first electrode and a second electrode disposed on a first substrate and a deformable electrode structure. The deformable electrode structure overlaps the first electrode and the second electrode to define a variable capacitance between the first electrode and the second electrode that changes with the deformation of the deformable electrode structure. The deformable electrode structure comprises a spacing component configured to provide spacing between the deformable electrode structure and the first electrode and the second electrode. Finally, a transmission component is configured such that biasing the transmission component causes the deformable electrode structure to deform and change the variable capacitance. A measurement of the variable capacitance can be used to determine force information regarding the force biasing the transmission component.

In another embodiment the devices and methods utilize a transmitter electrode and receiver electrode disposed on a first substrate and a deformable electrode structure. The deformable electrode structure overlaps at least a portion of the transmitter electrode and the receiver electrode to define a variable capacitance between the transmitter electrode and the receiver electrode that changes with the deformation of the deformable electrode structure.

In some embodiments the deformable electrode structure comprises both a spacing component and a transmission component. The spacing component is part of the deformable electrode structure and is configured to provide spacing between the deformable electrode structure and the transmitter electrode and the receiver electrode. Also, in some embodiments the transmission component is also part of the deformable electrode structure and is configured such that force biasing the transmission component causes the causes the deformable electrode structure to deform relative to the transmitter and receiver electrode and change the variable capacitance. A measurement of the variable capacitance can be used to determine force information regarding the force biasing the transmission component.

In some embodiments a processing system is communicatively coupled to the deformable electrode and the first and second electrodes, wherein the processing system is configured to determine a capacitance value of the variable capacitance and to determine force information from the capacitance value In one specific embodiment, the input device and method are implemented with capacitive sensor electrodes. In such an embodiment, the capacitive sensor electrodes may be configured to determine positional information for objects that are in a sensing region. In various implementations, the capacitive sensor electrodes may be implemented on the first substrate or other substrates. These implementations offer potential advantages of sharing components between the proximity sensor and the force sensor. Stated another way, these implementations allow force sensing to be added to a proximity sensor with relatively low additional cost and complexity.

Thus, the various embodiments provide improved input device performance by facilitating the determination of force information for one or more input objects.

BRIEF DESCRIPTION OF DRAWINGS

The preferred exemplary embodiment of the present invention will hereinafter be described in conjunction with the appended drawings, where like designations denote like elements, and:

FIGS. 1A-C are a cross-sectional side view and top views of a force sensor in accordance with an embodiment of the invention;

FIGS. 2A-B are a cross-sectional side view and a top view of a force sensor in accordance with an embodiment of the invention;

FIGS. 6A-B are a cross-sectional side view and a schematic view of a force sensor in accordance with an embodiments of the invention;

DETAILED DESCRIPTION OF THE INVENTION

Figure 3B:
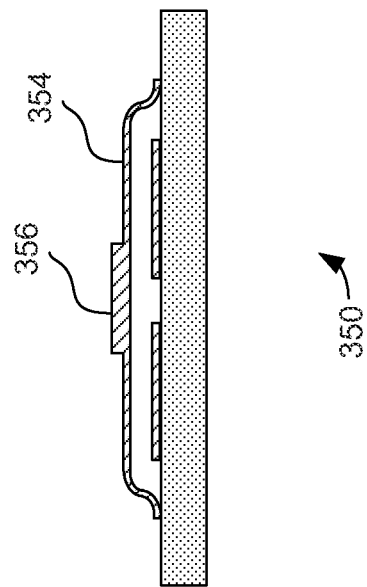
FIGS. 3A-B are cross-sectional side views of force sensors in accordance with embodiments of the invention.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Devices and methods are provided that facilitate improved input device performance. Specifically, the devices and methods provide an input device with force sensing in a cost effective and efficient manner. Turning now to FIGS. 1A, and 1B, a cross-sectional and partial top view of an input device 100 is illustrated. The input device 100 includes a first substrate 102, a deformable electrode structure 104, a first electrode 108, and a second electrode 110. The deformable electrode structure 104 overlaps the first electrode 108 and the second electrode 110 to define a variable capacitance between the first electrode 108 and the second electrode 110 that changes with the deformation of the deformable electrode structure 104. The deformable electrode structure 104 comprises an electrode component 112 and a spacing component 114. The spacing component 114 is configured to provide spacing between the electrode component 112 of deformable electrode structure 104 and the first electrode 108 and the second electrode 110. The deformable electrode structure 104 is deformable such that biasing causes the deformable electrode structure 104 to deform and change the variable capacitance. A measurement of the variable capacitance can be used to determine force information regarding the force biasing.

An example of such force biasing is illustrated in FIG. 1C As shown in this figure, force 120 biasing the deformable electrode structure 104 causes the deformable electrode structure 104 to deform, allowing the electrode component 112 of the deformable electrode structure 104 to move relative to the first electrode 108 and the second electrode 110. As the distance between the deformable electrode structure 104 and the first electrode 108 and the second electrode 110 changes, the variable capacitance defined in part by the deformable electrode structure 104, electrodes 108 and 110, changes. A measurement of the variable capacitance between electrodes can thus be used to determine force information for the object providing the biasing force.

In some embodiments the first electrode 108 comprises a transmitter electrode while the second electrode 110 comprises a receiver electrode. In these embodiments the variable capacitance is a transcapacitance between the first electrode 108 and the second electrode 110 that is measured by transmitting a signal from the first electrode 108 and receiving a resulting signal with the second electrode 110. This variable capacitance between the first electrode 108 and the second electrode 110 changes with the deformation of the deformable electrode structure 104 and thus the transcapacitance can be measured and used to determine force information.

In the illustrated embodiment of FIG. 1, the deformable electrode structure comprises both an electrode component 112 and a spacing component 114. In general, the configuration of the electrode component 112 facilitates deformation toward the first electrode 108 and second electrode 110, thus providing the variable capacitance that may be measured. The configuration of the spacing component 114 is such that the spacing component 114 provides the needed space between the electrode component 112 and the first electrode 108 and the second electrode 110, allowing deformation of the deformable electrode structure 104.

As noted above, the spacing component 114 and electrode component 112 are both part of the same deformable electrode structure 104. As examples, the deformable electrode structure 104 may be formed from a single piece of material using a formation process such as stamping or coining. In these embodiments a single piece of material may be shaped to provide both the electrode component 112 and the spacing component 114 of the deformable electrode structure 104. Detailed examples of such techniques that may be used to form the deformable electrode structure 104 will be discussed below.

As was noted above, in some embodiments the input device also includes a transmission component. In general, the transmission component is configured such that force biasing the transmission component causes the causes the deformable electrode structure 104 to deform relative to the first electrode 108 and the second electrode 110 to change the variable capacitance. In some embodiments this transmission component is implemented as a separate element that is physically coupled to the deformable electrode structure 104 to facilitate the deformation responsive to the applied force.

In other embodiments the transmission component is formed as part of the deformable electrode structure. As examples, a deformable electrode structure that comprises an electrode component, a spacing component, and a transmission component may be formed from a single piece of material using a formation process such as stamping or coining. In these embodiments a single piece of material may again be shaped to provide all three major components, including the electrode component, the spacing component, and the transmission component. Detailed examples of such embodiments will be discussed below with reference to FIGS. 2-3.

In some embodiments a processing system is communicatively coupled to the deformable electrode structure 104 and the first electrode 108 and the second electrode 110, wherein the processing system is configured to determine a capacitance value of the variable capacitance and to determine force information from the capacitance value. Detailed examples of such an embodiment will be discussed below with reference to FIG. 7.

In some embodiments, the input device and method are implemented with additional capacitive sensor electrodes. In such an embodiment, the capacitive sensor electrodes may be configured to determine positional information for objects that are in a sensing region. In various implementations, the capacitive sensor electrodes may be implemented on the first substrate 102 or other proximate substrates. These implementations offer potential advantages of sharing components between the proximity sensor and the force sensor. Stated another way, these implementations allow force sensing to be added to a proximity sensor with relatively low additional cost and complexity. Examples of such embodiments will be discussed with reference to FIGS. 8 and 9.

It should be noted that the example implementation shown in FIGS. 1A-1D is merely one type of configuration that can be used. For example, the input device 100 shows an implementation with a generally circular shape and without an integral transmission component. Turning now to FIG. 2, a second embodiment of an input device 200 is illustrated. Specifically, FIGS. 2A and 2B illustrates a cross-sectional and partial top view of an input device 200. The input device 100 includes a first substrate 202, a deformable electrode structure 204, a first electrode 208, and a second electrode 210. The deformable electrode structure 204 overlaps the first electrode 208 and the second electrode 210 to define a variable capacitance between the first electrode 208 and the second electrode 210 that changes with the deformation of the deformable electrode structure 204.

In this embodiment, the deformable electrode structure 204 comprises an electrode component 212, a spacing component 214 and a transmission component 216. The spacing component 214 is configured to provide spacing between the electrode component 212 of deformable electrode structure 204 and the first electrode 208 and the second electrode 210. The deformable electrode structure 204 is deformable such that biasing of the transmission component 216 causes the deformable electrode structure 204 to deform and change the variable capacitance. A measurement of the variable capacitance can be used to determine force information regarding the force biasing the transmission component 216.

An increase in the force biasing the transmission component 216 causes the deformable electrode structure 204 to deform, allowing the electrode component 112 of the deformable electrode structure 204 to move relative to the first electrode 208 and the second electrode 210. As the distance between the deformable electrode structure 204 and the first electrode 208 and the second electrode 210 changes, the variable capacitance defined in part by the deformable electrode structure 204, electrodes 208 and 210, changes. A measurement of the variable capacitance between electrodes can thus be used to determine force information for the object providing the biasing force. In some embodiments the first electrode 208 comprises a transmitter electrode while the second electrode 210 comprises a receiver electrode. In these embodiments the variable capacitance is a transcapacitance between the first electrode 208 and the second electrode 210 that is measured by transmitting from the first electrode 108 and receiving a resulting signal with the second electrode 210. This variable capacitance between the first electrode 208 and the second electrode 210 changes with force biasing the transmission component 216 and causing the deformation of the deformable electrode structure 204. Thus, the transcapacitance can be measured and used to determine force information.

In the illustrated embodiment of FIG. 2, the deformable electrode structure 204 comprises an electrode component 212, spacing components 214, and a transmission component 216. In general, the configuration of the electrode component 212 facilitates deformation toward the first electrode 208 and second electrode 210, thus providing the variable capacitance that may be measured. The configuration of the spacing components 214 are such that the spacing components 214 provide the needed space between the deformable electrode structure 204 and the first electrode 208 and the second electrode 210.

As noted above, the electrode component 212, the spacing components 214 and the transmission component 216 are all part of the same deformable electrode structure 204. As examples, the deformable electrode structure 204 may be formed from a single piece of material using a formation process such as stamping or coining. In these embodiments a single piece of material may be shaped to provide the electrode component 112, the spacing components 214 and the transmission component all as one piece of material. Detailed examples of such techniques that may be used to form the deformable electrode structure 204 will be discussed below.

In some implementations, such an input device 200 can have a relatively linear response to force. That is, as force is applied to the transmission component 216 and biases the deformable electrode structure 204, the resulting change in capacitance is a function of the amount of relative movement between electrode component 212 and the first and second electrodes 108 and 210. Likewise, the amount of bias is a function of the force applied to the transmission component 216. With the appropriate selection of materials and geometries, relatively largely linear response between a measured change in capacitance and the force applied can be designed. Thus implemented, the input device 200 may provide an accurate and useful measure of applied force.

In a typical implementation, a touch layer, and in some cases other additional layers would cover the transmission component 216. In these embodiments, an input object such as s finger applies force through these additional layers, but otherwise applies force "directly" to the transmission component 216. The transmission component 216 "transmits" that force to electrode component 212, causing the electrode component 212 to move relative to first electrode 208 and the second electrode 210.

Finally, it should be noted that while FIG. 1 illustrates an input device 100 with a deformable electrode structure 104 that has a substantially circular shape, and while FIG. 2 illustrates an input device 200 with a deformable electrode structure 204 that has a substantially rectangular shape, that such shapes and configurations are merely two examples of variety of shapes and configurations that may be implemented.

Figure 3A:
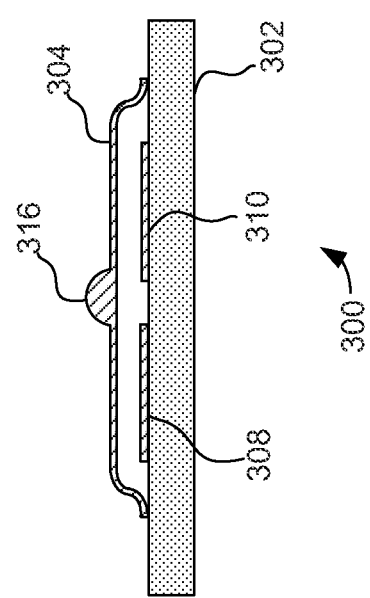

In the embodiment of FIG. 2, the input device 200 includes a deformable electrode structure 204 with an integral transmission component 216. In that illustrated example, the transmission component 216 comprised a portion of the deformable electrode structure 204 that is curved to provide the transmission component 216. However, this is just one example of such a transmission component. Turning now to FIG. 3, other examples of a transmission component integrated with the deformable electrode structure are illustrated. Specifically, FIG. 3A illustrates an input device 300 that includes a first substrate 302, a deformable electrode structure 304, a first electrode 308, and a second electrode 310. In this illustrated embodiment the deformable electrode structure 304 includes an integral transmission component 316. Again, such an integral transmission component 316 can be created by forming the entire deformable electrode structure from a single piece of material. However, in this embodiment the transmission component 316 is not just a curved portion of the deformable electrode structure 304, but is instead an element that has significant additional material thickness and shape.

FIG. 3A illustrates another example of an input device 350 that includes a deformable electrode structure 354 having an integral transmission component 356. In this embodiment the transmission component 356 comprise a portion of the deformable electrode structure 354 having additional thickness.

Again, these are just example of deformable electrode structures that are formed with integral transmission components and a variety of other shapes, structures, and configurations may be used.

Finally, it should be noted that in these various embodiments the force applied by input objects may be either "directly" or "indirectly" applied to the transmission component. In "indirectly" embodiments the force is applied by an input object pushing the input device against a backing structure, such as pushing the entire input device against a fixed substrate. In contrast, in "directly" embodiments the force is applied directly to the transmission component. In these embodiments the force may be transmitted through one or more intermediate layers, but the force is ultimately directly applied to the transmission component.

Figure 4:
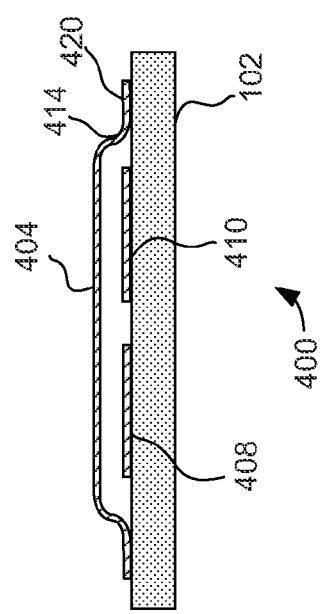
FIG. 4 is a cross-sectional side view of a force sensor in accordance with an embodiment of the invention.

In the embodiments of FIG. 1-3, the various input devices include a deformable electrode structure with an integral spacing component. In these examples, the spacing components comprised portions of the deformable electrode structure that were curved to provide the spacing between the deformable electrode structure and the first and second electrodes. However, these are just some examples of such a transmission component. Turning now to FIG. 4, another example of a transmission component integrated with the deformable electrode structure is illustrated. Specifically, FIG. 4 illustrates an input device 400 that includes a first substrate 402, a deformable electrode structure 404, a first electrode 408, and a second electrode 410. In this illustrated embodiment the deformable electrode structure 404 includes a spacing component 414. Again, such an integral spacing component 414 can be created by forming the entire deformable electrode structure from a single piece of material.

In this embodiment, an attachment component 420 is configured to be physically coupled to the first substrate. In this illustrated embodiment the attachment component 420 is an extension of the spacing component. However, this is just one example, and other implementations may be used. Furthermore, other implementations of the spacing component are possible. For example, deformable electrode structures may be formed with integral spacing components having a variety of other shapes, structures, and configurations.

The various input devices described above include a deformable electrode structure with an integral spacing component. These deformable electrode structures can take a variety of forms and structures. For example, in addition to the shapes and structures illustrated above, a variety of features may be implemented to facilitate the repeated deformation of the deformable electrode structure. These features include a variety of shapes and materials. As one example, one or more openings may be formed in the deformable electrode structure to facilitate repeated deformations.

Figure 5:
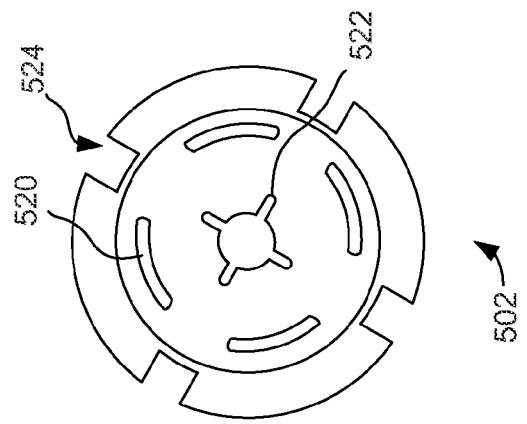
FIG. 5 is a cross-sectional side view of a force sensor in accordance with an embodiment of the invention.

Turning now to FIG. 5, another example of deformable electrode structure is illustrated. Specifically, FIG. 5 illustrates a perspective view of a deformable electrode structure 502 that includes a plurality of openings 520, a star-shaped transmission element 522, and a plurality of notches 524. In general, the plurality of openings 520 may be formed in the deformable electrode structure to facilitate the reliable deformation of the electrode structure 502 toward the first and second electrodes. As such, the presence of the openings can improve the reliability and lifespan of the device.

Likewise, the star shaped transmission element 522 provides an integral structure that receives applied force and causes the causes the electrode component of the deformable electrode structure 104 to deform relative to the first and second electrodes. The star-shape of the transmission element is just one example of a shape of the transmission element which can be used. Specifically, various appropriate shapes for the transmission element can be used depending on the deformation properties desired from the materials used. Again, such an integral transmission component 522 can be created by forming the entire deformable electrode structure 502 from a single piece of material.

The plurality of notches 524 are formed to provide attachment points for attaching to the underlying substrate. In using these attachment points various attachment methods, such as soldering may be used. Furthermore, one or more of the plurality of notches may be used as alignment guides to position the deformable electrode structure 502.

Of course, these are just some examples of the type of additional shapes and structures that may be added to such an electrode structure. For example, openings and other elements may be provided having a variety of other shapes, structures, and configurations.

The various embodiments described above provide deformable electrode structures that facilitate accurate determinations of force information. These deformable electrode structures generally include both an electrode component and a spacing component that are integrally formed together. Additionally, in some embodiments other features, including various openings, attachment components and transmission components may be integrally formed with the deformable electrode structure.

A variety of different techniques and materials may be used to form such structures. For example, it is generally desirable to form the deformable electrode structure from a conductive material having relatively high yield strength and elastic properties. The relatively high yield strength allows the deformable electrode structure to repeatedly deform and return to the original shape. Examples of such materials include various carbon steels generally referred to as "spring steel". Other examples include stainless steel, beryllium-copper, phosphor-bronze, or similar.

Furthermore, a variety of different techniques may be used to form such structures regardless of the specific techniques used. For example, processes such as stamping may be used to form the deformable electrode structure. In general, stamping forms specific shapes and structures from sheet material using devices such as machine presses or stamping presses. Such processes may form the deformable electrode structure in one step, or may use multiple stage operations to form complex shapes and structures. In any case, stamping may be used to form the deformable electrode structure from a single sheet of material, and as such may be used to form the electrode component, spacing component and transmission component integrally together.

In some embodiments specific types of stamping may be used. For example, in some embodiments a precision form of stamping referred to as coining may be used. In coining a large amount of force is used to plastically deform the work piece such that it conforms to a die. Such a technique provides the potential advantage of manufacturability to higher tolerances.

As was described above, in some embodiments the first electrode comprises a transmitter electrode while the second electrode comprises a receiver electrode. In these embodiments the variable capacitance is a transcapacitance between the first electrode and the second electrode that is measured by transmitting from the first electrode and receiving a resulting signal with the second electrode. These transcapacitive sensing methods are sometimes also referred to as "mutual capacitance sensing methods." A transcapacitive sensing method operates by detecting electric field lines coupling one or more transmitting electrodes with one or more receiving electrodes (and thus by detecting the surrounding electric field). Input objects may cause changes in the electric field, and produce changes in the transcapacitive coupling that are detectable by a transcapacitive sensing method. For example, the transcapacitive sensing method may detect changes such as changes in voltage, current, and the like.

In one embodiment with a first set of sensor electrodes and second set of sensor electrodes, the first set of sensor electrodes transmit electrical signals while the second set of sensor electrodes receive electrical signals. In this embodiment, at least one sensor electrode of the first set of sensor electrodes transmits electrically and at least one sensor electrode of the second set of sensor electrodes receives the resulting signal. The sensor electrode(s) of the first set of sensor electrodes that transmit are sometimes referred to as the "transmitting sensor electrode(s)," "driving sensor electrode(s)," "transmitter(s)," or "driver(s)"—at least for the duration when they are transmitting. Other names may also be used, including contractions or combinations of the earlier names (e.g. "driving electrode(s)" or "driver electrode(s)"). The sensor electrode(s) of the second set of sensor electrodes that receive are sometimes referred to as the "receiving sensor electrode(s)," "receiver electrode(s)," or "receiver"—at least for the duration when they are receiving. Similarly, other names may also be used, including contractions or combinations of the earlier names.

In some embodiment additional features may be included to improve the performance of the device. Turning now to FIGS. 6A and 6B, an input device 600 is illustrated that includes a first substrate 602, a deformable electrode structure 604, a transmitter electrode 608, a receiver electrode 610, a floating electrode 620, and an insulating layer 622. Specifically, FIG. 6A illustrates these components schematically, while FIG. 6B illustrates the electrode components as part of a circuit diagram with the associated capacitances. Specifically, FIG. 6B illustrates the capacitance Ct between the transmitter electrode 608 and the floating electrode 620, the capacitance Cr between the receiver electrode 610 and the floating electrode 620, and the variable capacitance Cx between the deformable electrode structure 604 and the floating electrode 620.

In this embodiment the floating electrode 620 is configured to be electrically floating during operation (i.e., ohmically insulated from other electrical components). By "electrically floating", it is meant that there is no significant ohmic contact between the floating electrode and other circuit elements of the input device, so that no meaningful amount of charge can flow onto or off of the floating electrode under normal circumstances. Of course, any charge present on the conductive floating electrode can still redistribute itself in the presence of an electric field. Thus, the deflectable electrode is capacitively coupled to the transmitter and receiver electrodes, but it is not ohmically coupled significantly to those or other circuit elements, and it does not require any wiring or other forms of electrical connection to other circuit elements. In general, this embodiment operates in a manner similar to that described above, with the addition of the floating electrode used to create a variable capacitance between the deformable electrode structure 604 and the floating electrode which can be measured to determine a force applied to the deformable electrode structure 604.

The various embodiments illustrated and described with reference to FIGS. 1-6 are particularly applicable to input devices that combine both proximity sensing and force sensing. In such embodiments, capacitive sensor electrodes may be configured to determine positional information for objects that are in a sensing region. In various implementations, the capacitive sensor electrodes may be implemented on the various substrates of the input device described in FIG. 1-6, as will described below. Such implementations offer significant potential advantages in that key components may be shared between the proximity sensor and the force sensor(s). Stated another way, these implementations allow force sensing to be added to a proximity sensor with relatively low additional cost and complexity.

Figure 7:
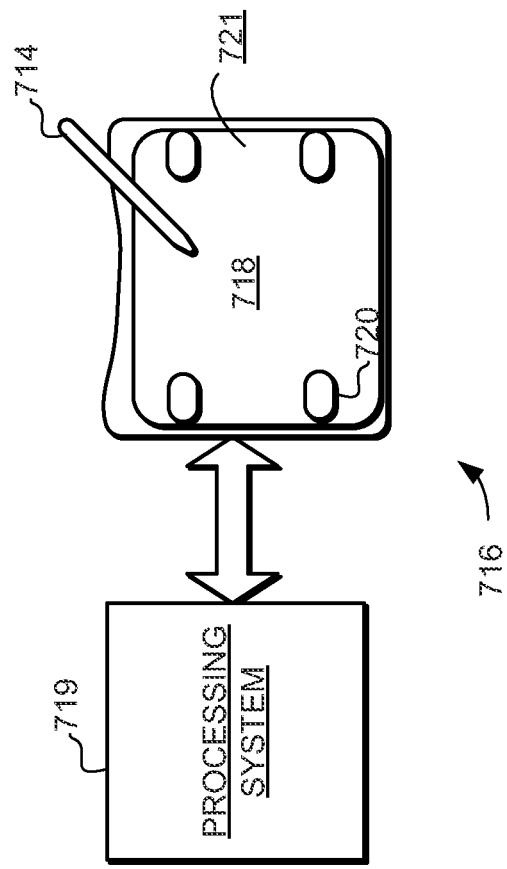
FIG. 7 is a block diagram of a input device in accordance with embodiments of the invention.

Turning now to FIG. 7, a block diagram illustrates an input device 716 that combines a proximity sensor with a plurality of force sensors. The input device 716 uses both the proximity sensor and the force sensors to provide an interface for the electronic system. The input device 716 has a processing system 719, an input surface 721, sensing region 718 and four force sensors 720 implemented proximate the sensing region 718. As will be described in greater detail below, each of the force sensors 720 may be implemented with any of the various embodiments of force sensing input devices described above and below, and thus may be configured to provide a variety of force sensing. Furthermore, it should be noted that one or more force sensors may be provided inside or outside the perimeter of the input surface 721. Not shown in FIG. 7 is an array of sensing electrodes that are adapted to capacitively sense objects in the sensing region 718.

The input device 716 is adapted to provide user interface functionality by facilitating data entry responsive to the position of sensed objects and the force applied by such objects. Specifically, the processing system 719 is configured to determine positional information for objects sensed by a sensor in the sensing region 718. This positional information can then be used by the system 700 to provide a wide range of user interface functionality. Furthermore, the processing system 719 is configured to determine force information for objects from measures of force determined by the force sensors 720. This force information can then also be used by the system 700 to provide a wide range of user interface functionality. For example, by providing different user interface functions in response to different levels of applied force by objects in the sensing region.

The input device 716 is sensitive to input by one or more input objects (e.g. fingers, styli, etc.), such as the position of an input object 714 within the sensing region 718. Sensing region 718 encompasses any space above, around, in and/or near the input device 716 in which the input device 716 is able to detect user input (e.g., user input provided by one or more input objects 714). The sizes, shapes, and locations of particular sensing regions may vary widely from embodiment to embodiment. In some embodiments, the sensing region 718 extends from a surface of the input device 714 in one or more directions into space until signal-to-noise ratios prevent sufficiently accurate object detection. The distance to which this sensing region 718 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device 714, contact with an input surface (e.g. a touch surface) of the input device 714, contact with an input surface of the input device 714 coupled with some amount of applied force or pressure, and/or a combination thereof. In various embodiments, input surfaces may be provided by surfaces of casings within which the sensor electrodes reside, by face sheets applied over the sensor electrodes or any casings, etc.

The input device 714 may utilize any combination of sensor components and sensing technologies to detect user input in the sensing region 718. The input device 714 comprises one or more sensing elements for detecting user input. As several non-limiting examples, the input device 714 may use capacitive, elastive, resistive, inductive, magnetic, acoustic, ultrasonic, and/or optical techniques.

Some implementations are configured to provide images that span one, two, three, or higher dimensional spaces. Some implementations are configured to provide projections of input along particular axes or planes.

In some resistive implementations of the input device 714, a flexible and conductive first layer is separated by one or more spacer elements from a conductive second layer. During operation, one or more voltage gradients are created across the layers. Pressing the flexible first layer may deflect it sufficiently to create electrical contact between the layers, resulting in voltage outputs reflective of the point(s) of contact between the layers. These voltage outputs may be used to determine positional information.

In some inductive implementations of the input device 714, one or more sensing elements pick up loop currents induced by a resonating coil or pair of coils. Some combination of the magnitude, phase, and frequency of the currents may then be used to determine positional information.

In some capacitive implementations of the input device 714, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g. system ground), and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g. other electromagnetic signals). Sensor electrodes may be dedicated transmitters or receivers, or may be configured to both transmit and receive.

In FIG. 7, a processing system 719 is shown as part of the input device 716. The processing system 719 is configured to operate the hardware of the input device 716 to detect input in the sensing region 718. The processing system 719 comprises parts of or all of one or more integrated circuits (ICs) and/or other circuitry components. For example, a processing system for a mutual capacitance sensor device may comprise transmitter circuitry configured to transmit signals with transmitter sensor electrodes, and/or receiver circuitry configured to receive signals with receiver sensor electrodes). In some embodiments, the processing system 719 also comprises electronically-readable instructions, such as firmware code, software code, and/or the like. In some embodiments, components composing the processing system 719 are located together, such as near sensing element(s) of the input device 716. In other embodiments, components of processing system 719 are physically separate with one or more components close to sensing element(s) of input device 716, and one or more components elsewhere. For example, the input device 716 may be a peripheral coupled to a desktop computer, and the processing system 719 may comprise software configured to run on a central processing unit of the desktop computer and one or more ICs (perhaps with associated firmware) separate from the central processing unit. As another example, the input device 716 may be physically integrated in a phone, and the processing system 719 may comprise circuits and firmware that are part of a main processor of the phone. In some embodiments, the processing system 719 is dedicated to implementing the input device 716. In other embodiments, the processing system 719 also performs other functions, such as operating display screens, driving haptic actuators, etc.

The processing system 719 may be implemented as a set of modules that handle different functions of the processing system 719. Each module may comprise circuitry that is a part of the processing system 719, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, the processing system 719 responds to user input (or lack of user input) in the sensing region 718 directly by causing one or more actions. Example actions include changing operation modes, as well as GUI actions such as cursor movement, selection, menu navigation, and other functions. In some embodiments, the processing system 719 provides information about the input (or lack of input) to some part of the electronic system (e.g. to a central processing system of the electronic system that is separate from the processing system 719, if such a separate central processing system exists). In some embodiments, some part of the electronic system processes information received from the processing system 719 to act on user input, such as to facilitate a full range of actions, including mode changing actions and GUI actions.

For example, in some embodiments, the processing system 719 operates the sensing element(s) of the input device 716 to produce electrical signals indicative of input (or lack of input) in the sensing region 718. The processing system 719 may perform any appropriate amount of processing on the electrical signals in producing the information provided to the electronic system. For example, the processing system 719 may digitize analog electrical signals obtained from the sensor electrodes. As another example, the processing system 719 may perform filtering or other signal conditioning. As yet another example, the processing system 719 may subtract or otherwise account for a baseline, such that the information reflects a difference between the electrical signals and the baseline. As yet further examples, the processing system 719 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

Likewise, the term "force information" as used herein is intended to broadly encompass force information regardless of format. For example, the force information can be provided for each object as a vector or scalar quantity. As another example, the force information can be provided as an indication that determined force has or has not crossed a threshold amount. As other examples, the force information can also include time history components used for gesture recognition. As will be described in greater detail below, positional information and force information from the processing systems may be used to facilitate a full range of interface inputs, including use of the proximity sensor device as a pointing device for selection, cursor control, scrolling, and other functions.

In some embodiments, the input device 716 is implemented with additional input components that are operated by the processing system 719 or by some other processing system. These additional input components may provide redundant functionality for input in the sensing region 718, or some other functionality.

In some embodiments, the input device 716 comprises a touch screen interface, and the sensing region 718 overlaps at least part of an active area of a display screen. For example, the input device 716 may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 716 and the display screen may share physical elements. For example, some embodiments may utilize some of the same electrical components for displaying and sensing. As another example, the display screen may be operated in part or in total by the processing system 719.

It should be understood that while many embodiments of the invention are described in the context of a fully functioning apparatus, the mechanisms of the present invention are capable of being distributed as a program product (e.g., software) in a variety of forms. For example, the mechanisms of the present invention may be implemented and distributed as a software program on information bearing media that are readable by electronic processors (e.g., non-transitory computer-readable and/or recordable/writable information bearing media readable by the processing system 719). Additionally, the embodiments of the present invention apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

As noted above, the input device 716 may be implemented with a variety of different types and arrangements of capacitive sensing electrodes. To name several examples, the capacitive sensing device may be implemented with electrode arrays that are formed on multiple substrate layers, including parts of the same layers used to form the force sensors. As one specific embodiment, electrodes for sensing in one direction (e.g., the "X" direction) may formed on a first layer (e.g., on a first side of the first substrates of FIGS. 1-6, or any other suitable substrate), while the electrodes for sensing in a second direction (e.g., the "Y" direction are formed on a second layer (e.g., on another side of the first substrate or any other suitable substrate).

In other embodiments, the electrodes for both the X and Y sensing may be formed on the same layer, with that same layer comprising any of the substrates described in FIGS. 1-6. In yet other embodiments, the electrodes may be arranged for sensing in only one direction, e.g., in either the X or the Y direction. In still another embodiment, the electrodes may be arranged to provide positional information in polar coordinates, such as "r" and "θ" as one example. In these embodiments the electrodes themselves are commonly arranged in a circle or other looped shape to provide "θ", with the shapes of individual electrodes used to provide "r". Also, a variety of different electrode shapes may be used, including electrodes shaped as thin lines, rectangles, diamonds, wedge, etc. Finally, a variety of conductive materials and fabrication techniques may be used to form the electrodes. As one example, the electrodes are formed by the deposition and etching of copper or ITO on a substrate.

Figure 8:
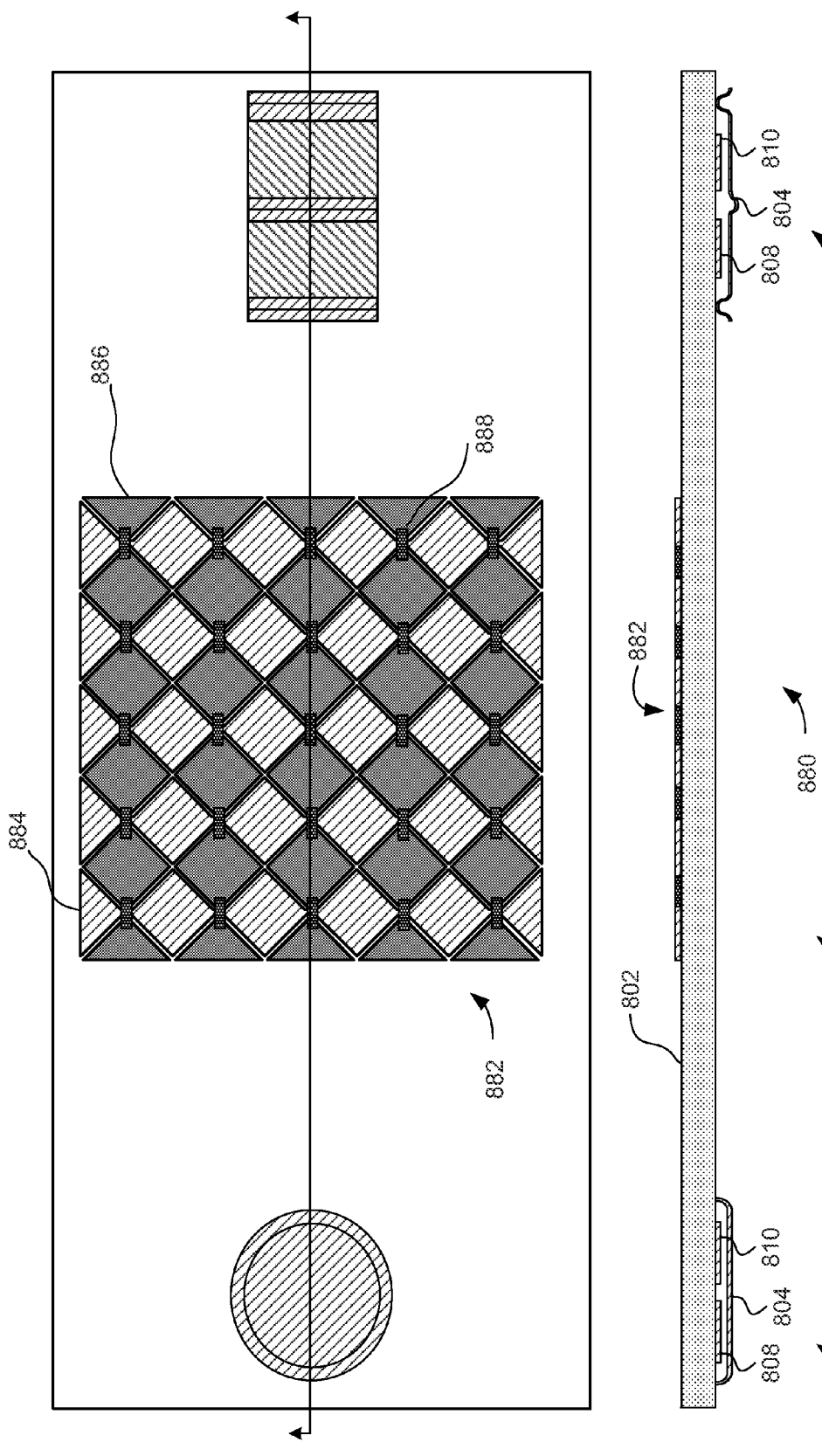
FIGS. 8-9 are cross sectional side and top views of input devices in accordance with embodiments of the invention.

Turning now to FIG. 8, cross-sectional and top views of input device 800 are illustrated. The input device 800 is implemented with two force sensors 840 and 860, one proximate each end, and a proximity sensor 880 between the force sensors. In this embodiment, the first force sensor 840 has a substantially round shape, while the second force sensor 880 has a substantially rectangular shape, although these are just examples of the types of shapes that may be used.

The input device 800 includes a first substrate 802. Each force sensor includes a first electrode 808, a second electrode 810, and a deformable electrode structure 804. In these embodiments, the deformable electrode structure 804 comprises an electrode component and a spacing component. The spacing component is configured to provide spacing between the deformable electrode structure 804 and the first electrode 808 and the second electrode 812. The deformable electrode structure 804 is deformable such that biasing of the deformable electrode structure 804 causes a change in the variable capacitance. A measurement of the variable capacitance can be used to determine force information.

Between the force sensors is an array of capacitive sensing electrodes 882. In the illustrated embodiment, the array of capacitive sensor electrodes comprises a first plurality of electrodes 884 and a second plurality of electrodes 886 that are both disposed in the same layer (on substrate 802). In those embodiments the first plurality of electrodes 884 may comprise the transmitter electrodes, while the second plurality of electrodes 886 may comprise the receiver electrodes. Specifically, the first plurality of electrodes 884 comprises a row of interconnected diamond shaped electrodes arranged in a first direction. Likewise, the second plurality of electrodes 886 comprises a row of diamond-shaped electrodes connected by jumpers 888 and arranged in a second direction perpendicular to the first direction. When so configured, the electrodes facilitate the capacitive detection of objects in the sensing region and the determination of positional information from that capacitive detection.

Returning to the force sensors, as with the embodiments described above, the deformable electrode structure 804, the first electrode 808 and the second electrode 810 define at least part of a variable capacitance. Measurements of this variable capacitance may be determined and used to determine force information regarding a force that is biasing the force sensors. Specifically, when an input object applies force the deformable electrode structure 804 moves move relative to the first electrode 808 and second electrode 810, thus changing the variable capacitance. A measurement of the change variable capacitance can be used to determine force information at the corresponding force sensors. The force information from the multiple sensors 840 and 860 can be combined to determine force information for objects being used to apply pressure.

It is important to note that in this example the proximity sensor 880 and the force sensors 840 and 860 share common elements. Specifically, the first substrate 802 is shared between all devices. Furthermore, the capacitive sensing electrodes 882 and the first electrodes 808 and second electrodes 810 may all be formed on the same side of the first substrate (not shown). Because of this, the marginal cost and added complexity required to add force sensors to a proximity sensor is relatively low. This is particularly true where the various substrate materials and electrodes are already present in the proximity sensor.

It should be noted that while FIG. 8 shows an example where all the proximity sensor 880 electrodes are formed on a different side of the substrate 802 from the force sensors 840 and 860, that this is just one example implementation. For example, the various capacitive and force sensing electrodes could instead be disposed on the same side of the same substrate, or on multiple different substrates.

To give several examples, in some embodiments the electrodes may be formed on opposite sides of the same substrate. In these embodiments the capacitive sensor electrodes may be formed on both sides of either the first substrate 802 or any other suitable substrate.

Figure 9:
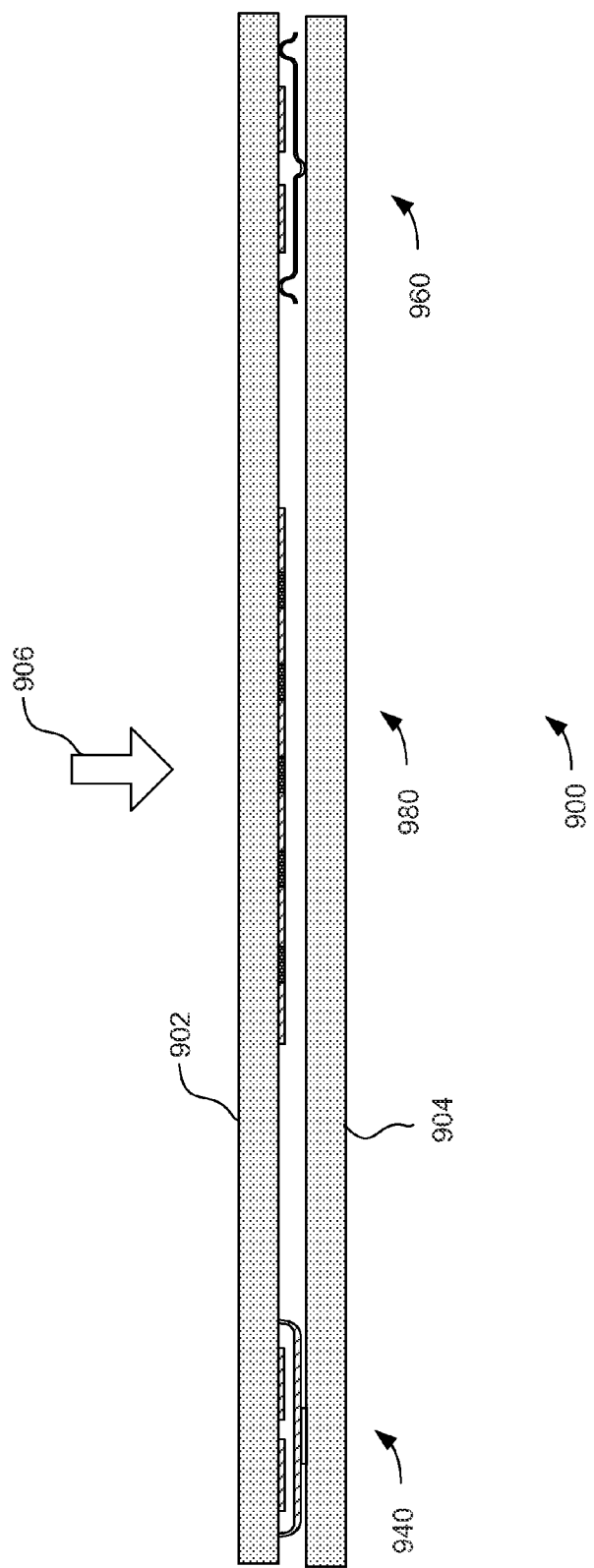

Turning now to FIG. 9, a cross-sectional view of an input device 900 is illustrated. The input device 900 is again implemented with two force sensors 940 and 960, one proximate each end, and a proximity sensor 980 between the force sensors. In this embodiment, the two force sensors 940 and 960 and the proximity sensor 980 are formed on the same side of a first substrate 902, while the transmission elements of each force sensor are physically coupled to a second substrate 904.

In the embodiment of FIG. 9, force from an input object (illustrated by arrow 906) is "indirectly" applied to the transmission components of the force sensors 940 and 960. Specifically, the biasing force pushes the input device 900 against the second substrate 904, and thus indirectly applies force to the transmission components. Specifically, force applied by the finger or other object causes an indirect application of force to the transmission component, which in turn causes the electrode components to again move relative to the first and second electrodes. This results in a change in the variable capacitance, such that a measurement of the change variable capacitance can be used to determine force information regarding the force applied by the input object.

It should be noted that device elements illustrated in the figures described above are not necessarily drawn to scale. Furthermore, it should be noted that the various illustrations are simplified representations of what a typical device would include. For example, various illustrations show electrodes intruding into or on top of various substrates. It should be understood that such illustrations are used to illustrate what substrate various electrodes are deposited onto. It is understood by one skilled in the art that such electrodes do not prevent various substrates from contacting uniformly nor do the illustrations imply that various electrodes somehow intrude upon a substrate which may be contacting the electrodes.

What is claimed is:

1. An input device, comprising:
   a first electrode and a second electrode disposed on a first substrate;
   a deformable electrode structure comprising:
   an electrode component that overlaps the first electrode and the second electrode to define a variable capacitance between the first electrode and the second electrode that changes with deformation of the deformable electrode structure;
   a spacing component that is in contact with the first substrate and that provides spacing between the electrode component and both the first electrode and the second electrode,
   wherein the first electrode and the second electrode are not electrically connected to the spacing component; and
   a transmission component configured such that force biasing the transmission component causes the deformable electrode structure to deform and change the variable capacitance; and
   a second substrate in contact with the transmission component that pushes, in response to a user applied force, the transmission element in the opposite direction of the user applied force causing the deformable electrode structure to deform in the opposite direction of the user applied force.

2. The input device of claim 1, wherein the first electrode comprises a transmitter electrode and wherein the second electrode comprises a receiver electrode.

3. The input device of claim 1, wherein the deformable electrode structure and the transmission component are integrally formed.

4. The input device of claim 1, wherein the deformable electrode structure and the transmission component are formed from a single piece of material.

5. The input device of claim 1, further comprising:
a third electrode disposed between the electrode component of the deformable electrode structure and the first and second electrodes, the third electrode separated from the first and second electrodes by an insulator, wherein the third electrode is configured to float electrically during operation.

6. The input device of claim 1, further comprising:
a plurality of capacitive sensor electrodes configured to detect objects in a sensing region; and
a processing system communicatively coupled to the plurality of capacitive sensor electrodes, the first electrode, and the second electrode, wherein the processing system is configured to:
  determine a capacitance value of the variable capacitance and to determine force information from the capacitance value; and
  operate the plurality of capacitive sensor electrodes to sense objects in the sensing region.

7. An input device, comprising:
a transmitter electrode and a receiver electrode disposed on a first substrate;
a deformable electrode structure comprising:
  an electrode component that overlaps at least a portion of the transmitter electrode and the receiver electrode to define a variable capacitance between the transmitter electrode and the receiver electrode;
  a spacing component that is in contact with the first substrate and that provides spacing between the electrode component and both the transmitter electrode and the receiver electrode,
  wherein the transmitter electrode and the receiver electrode are not electrically connected to the spacing component; and
  a transmission component configured such that force biasing the transmission component causes the deformable electrode structure to deform relative to the transmitter electrode and the receiver electrode and changes the variable capacitance;
a floating electrode disposed between the electrode component of the deformable electrode structure and the transmitter electrode and the receiver electrode,
wherein the third electrode separated from the transmitter electrode and the receiver electrode by an insulator, and
wherein the floating electrode is configured to float electrically during operation; and
a processing system communicatively coupled to the transmitter and receiver electrodes, and configured to:
  determine a capacitance value of the variable capacitance; and
  determine force information from the capacitance value.

8. The input device of claim 7, wherein the deformable electrode structure and the transmission component are integrally formed.

9. The input device of claim 7, wherein the deformable electrode structure is formed from a single piece of material.

10. The input device of claim 7, further comprising:
a plurality of capacitive sensor electrodes configured to detect objects in a sensing region,
wherein the processing system is further communicatively coupled to the plurality of capacitive sensor electrodes, and
wherein the processing system is further configured to operate the plurality of capacitive sensor electrodes to sense objects in the sensing region.

11. The input device of claim 7, further comprising:
a second substrate in contact with the transmission component that pushes, in response to a user applied force, the transmission element in the opposite direction of the user applied force causing the deformable electrode structure to deform in the opposite direction of the user applied force.

12. A method, comprising:
providing a first electrode and a second electrode disposed on a first substrate;
affixing a deformable electrode structure to the first substrate, the deformable electrode structure comprising:
  an electrode component that overlaps the first electrode and the second electrode to define a variable capacitance between the first electrode and the second electrode that changes with deformation of the deformable electrode structure;
  a spacing component that is in contact with the first substrate and that provides spacing between the electrode component and both the first electrode and the second electrode,
  wherein the first electrode and the second electrode are not electrically connected to the spacing component; and
  a transmission component configured such that force biasing the transmission component causes the deformable electrode structure to deform and change the variable capacitance; and
providing a third electrode disposed between the electrode component of the deformable electrode structure and the first and second electrodes, the third electrode separated from the first and second electrodes by an insulator, wherein the third electrode is configured to float electrically during operation.

13. The method of claim 12, wherein the deformable electrode structure and the transmission component are integrally formed.

14. The method of claim 12, wherein the deformable electrode structure is stamped from a single piece of material to shape the single piece of material into the deformable electrode structure.

15. The method of claim 12, wherein the deformable electrode structure is coined from a single piece of material to shape the single piece of material into the deformable electrode structure.

16. The method of claim 12, further comprising providing a plurality of capacitive sensor electrodes on the first substrate, the plurality of capacitive sensor electrodes configured to detect objects in a sensing region.

17. The method of claim 12, further comprising:
coupling a second substrate to the transmission component, wherein the second substrate pushes, in response to a user applied force, the transmission element in the opposite direction of the user applied force causing the deformable electrode structure to deform in the opposite direction of the user applied force.

18. An input device, comprising:
- a first electrode and a second electrode disposed on a first substrate;
- a deformable electrode structure comprising:
  - an electrode component that overlaps the first electrode and the second electrode to define a variable capacitance between the first electrode and the second electrode that changes with deformation of the deformable electrode structure;
  - a spacing component that is in contact with the first substrate and that provides spacing between the electrode component and both the first electrode and the second electrode,
  - wherein the first electrode and the second electrode are not electrically connected to the spacing component; and
  - a transmission component configured such that force biasing the transmission component causes the deformable electrode structure to deform and change the variable capacitance; and
- a third electrode disposed between the electrode component of the deformable electrode structure and the first and second electrodes, the third electrode separated from the first and second electrodes by an insulator, wherein the third electrode is configured to float electrically during operation.

* * * * *